US010516955B2

(12) United States Patent
Shen et al.

(10) Patent No.: US 10,516,955 B2
(45) Date of Patent: Dec. 24, 2019

(54) CORRECTION OF CURRENT MEASUREMENT IN AN AMPLIFIER

(71) Applicant: SYNAPTICS INCORPORATED, San Jose, CA (US)

(72) Inventors: Dan Shen, Irvine, CA (US); Davide Cartasegna, Oceanside, CA (US); Ketan B. Patel, Lake Forest, CA (US); Lorenzo Crespi, Costa Mesa, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/943,613

(22) Filed: Apr. 2, 2018

(65) Prior Publication Data

US 2018/0288543 A1    Oct. 4, 2018

Related U.S. Application Data

(60) Provisional application No. 62/479,720, filed on Mar. 31, 2017.

(51) Int. Cl.

| | | |
|---|---|---|
| *H04R 29/00* | (2006.01) | |
| *H03F 3/187* | (2006.01) | |
| *H03F 3/217* | (2006.01) | |
| *H04R 3/00* | (2006.01) | |
| *H03F 3/213* | (2006.01) | |

(Continued)

(52) U.S. Cl.
CPC ............. *H04R 29/001* (2013.01); *H03F 1/32* (2013.01); *H03F 1/52* (2013.01); *H03F 3/187* (2013.01);

(Continued)

(58) Field of Classification Search
CPC ...... H04R 29/001; H03F 1/32; H03F 2200/03

(Continued)

(56) References Cited

U.S. PATENT DOCUMENTS 5,773,997 A  *  6/1998  Stiegler ................... G11C 7/14
                                                  327/53
6,173,060 B1 *  1/2001  Huang .................. G04G 21/06
                                                  368/10

(Continued)

FOREIGN PATENT DOCUMENTS

EP           0693749            5/2001

OTHER PUBLICATIONS

Berkhout, Marco, et al., "A 4Ω 2.65W Class-D Audio Amplifier With Embedded DC-DC Boost Converter, Current Sensing ADC and DSP for Adaptive Speaker Protection," IEEE Journal of Solid-State Circuits, Dec. 2013, pp. 2952-2961, vol. 48, Issue 12, IEEE, New Jersey, U.S.A.

*Primary Examiner* — William J Deane, Jr.
(74) *Attorney, Agent, or Firm* — Haynes and Boone, LLP

(57) ABSTRACT

Systems and methods according to one or more embodiments are provided for correcting a current measurement through a speaker in an audio system. In one example, a system for driving a speaker includes an output stage configured to drive a current through the speaker. The system further includes a first and second current sensor coupled to the output stage and configured to measure a positive current including a first measurement error and a negative current including a second measurement error through the speaker, respectively. The system further includes a processing block coupled to the first and second current sensors to receive the measured positive and negative current signals and configured to add a positive offset value to an input of each first and second current sensors, determine the first and second measurement errors, and correct a measured current using the positive and negative currents and the determined first and second measurement errors.

20 Claims, 7 Drawing Sheets

(51) Int. Cl.
*H03F 1/32* (2006.01)
*H03F 1/52* (2006.01)

(52) U.S. Cl.
CPC ............ *H03F 3/213* (2013.01); *H03F 3/217* (2013.01); *H03F 3/2173* (2013.01); *H04R 3/007* (2013.01); *H03F 2200/03* (2013.01); *H03F 2200/33* (2013.01); *H03F 2200/462* (2013.01); *H04R 2499/11* (2013.01); *H04R 2499/15* (2013.01)

(58) Field of Classification Search
USPC .................................. 381/59, 58, 57, 56, 55
See application file for complete search history.

(56) References Cited

U.S. PATENT DOCUMENTS

| | | | |
|---|---|---|---|
| 8,378,745 B2 | 2/2013 | Dooper et al. | |
| 9,088,251 B2 | 7/2015 | Fei et al. | |
| 9,473,851 B2 | 10/2016 | Galal et al. | |
| 2008/0310046 A1* | 12/2008 | Menegoli | G11B 21/02 360/75 |
| 2012/0044020 A1* | 2/2012 | Siniscalchi | H03F 3/2173 330/251 |
| 2013/0088294 A1* | 4/2013 | Heineman | H03F 1/26 330/207 A |
| 2013/0127531 A1* | 5/2013 | Lesso | H03F 3/217 330/251 |
| 2015/0069997 A1* | 3/2015 | Kawahata | G01R 3/00 324/105 |
| 2015/0326228 A1* | 11/2015 | Guthrie | H02M 3/1584 327/105 |
| 2016/0065134 A1* | 3/2016 | Lu | H03F 1/523 330/251 |
| 2017/0085233 A1* | 3/2017 | Berkhout | H03F 3/45995 |
| 2017/0207759 A1* | 7/2017 | He | H03F 3/2173 |
| 2017/0358918 A1* | 12/2017 | Tsao | H02H 3/22 |
| 2017/0373655 A1* | 12/2017 | Mengad | H03F 3/393 |
| 2018/0014119 A1* | 1/2018 | Chawla | H03F 3/187 |

* cited by examiner

CORRECTION OF CURRENT MEASUREMENT IN AN AMPLIFIER

CROSS-REFERENCE TO RELATED APPLICATIONS

The present application claims the benefit of and priority to U.S. Provisional Patent Application No. 62/479,720, filed Mar. 31, 2017, which is fully incorporated herein by reference in its entirety.

TECHNICAL FIELD

The present disclosure relates generally to audio signal processing and, more particularly, to the measurement of current in an audio system.

BACKGROUND

Many modern devices such as laptop computers, computer tablets, MP3 players, and smart phones typically use miniature speakers. In many applications the volume and quality of the sound output from the miniature speakers affects a user's experience, particularly as audio output power rises. Due to limitations of miniature speakers used in such devices, constant monitoring of the power provided to the speaker may be implemented to avoid distortion or physical damage and other unwanted effects. It is desirable in such audio systems, therefore, to accurately and continuously monitor the current provided to the speaker in order to protect the speaker from distortion or damage.

SUMMARY

In accordance with one or more embodiments, systems and methods for continuous and accurate current sensing are disclosed. In various embodiments, a system for driving a speaker comprises an output stage operable to drive a current through the speaker, a first current sensor coupled to the output stage and operable to measure a positive current through the speaker, including a first measurement error, a second current sensor coupled to the output stage and operable to measure a negative current through the speaker, including a second measurement error, and a processing block coupled to the first and second current sensors to receive the measured positive current and the measured negative current.

In one or more embodiments the processing block is operable to add a positive offset value to an input of each of the first and second current sensors, determine the first and second measurement errors, and correct a measured current using a measured positive current and a measured negative current and the determined first and second measurement errors. The measured current is approximately equal to the measured positive current minus the measured negative current, in accordance with various embodiments.

In one or more embodiments, the system may further comprise a corrected measured speaker current, wherein the corrected measured speaker current is equal to the measured speaker current plus the second measurement error if the measured speaker current is less than or equal to a negative first measurement error minus the second measurement error. The corrected measured speaker current may be equal to the measured speaker current minus the first measurement error if the measured speaker current is greater than or equal to the first measurement error plus the second measurement error. The corrected measured speaker current may be equal to the measured speaker current minus the first measurement error plus the second measurement error, divided by two.

In one or more embodiments, the processing block comprises a current-to-voltage conversion circuit operable to convert the measured speaker current to an equivalent analog voltage signal, and the system may further comprise an analog to digital converter, wherein the analog to digital converter is operable to receive the analog voltage signal at an input port and provide a digitized voltage signal at an output port. In some embodiments, the processing block may be operable to receive the digitized voltage signal, provide the positive offset values, determine the first and second measurement errors, and correct the measured positive and negative currents.

In one or more embodiments the processing block is further operable to turn off the second current sensor to determine the first measurement error, and turn off the first current sensor to determine the second measurement error. In some embodiments, the added positive offset value at the input to each of the first and second current sensors generates associated magnitudes of the measured positive and negative currents that are positive non-zero values when there is no current through the speaker. In some embodiments, the first and second current sensors each comprise a current sensing amplifier, and the output stage is a class D amplifier H-bridge output stage.

In various embodiments, a method for driving a speaker comprises driving, by an output stage, a current traveling through the speaker, measuring, by a first current sensor, a positive current through the speaker, including a first measurement error, measuring, by a second current sensor, a negative current through the speaker, including a second measurement error, adding a positive offset value to an input of each of the first and second current sensors, determining, by a processing block, the first and second measurement errors, and correcting a measured current using measured positive and negative currents and the determined first and second measurement errors. The measured current may be approximately equal to the measured positive current minus the measured negative current. In one embodiment, the current sensors each comprise a current sensing amplifier, and the output stage comprises a class D amplifier H-bridge output stage.

In one or more embodiments, the method further comprises calculating a corrected measured speaker current, wherein the corrected measured speaker current is equal to the measured speaker current plus the second measurement error if the measured speaker current is less than or equal to a negative first measurement error minus the second measurement error, wherein the corrected measured speaker current is equal to the measured speaker current minus the first measurement error if the measured speaker current is greater than or equal to the first measurement error plus the second measurement error, and wherein the corrected measured speaker current is equal to the measured speaker current minus the first measurement error plus the second measurement error, divided by two.

In one or more embodiments, the method further comprises turning off the second current sensor to determine the first measurement error, and turning off the first current sensor to determine the second measurement error. The method may further comprise converting the measured speaker current to an equivalent analog voltage signal, and converting the analog voltage signal to a digitized voltage signal. In some embodiments, the method may further comprise receiving the digitized voltage signal, providing the positive offset values, determining the first and second measurement errors, and correcting the measured positive and negative currents.

A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

The included drawings are for illustrative purposes and serve to provide examples of possible systems and methods for measurement of current in an audio system. These drawings in no way limit any changes in form and detail that may be made to that which is disclosed by one skilled in the art without departing from the spirit and scope of this disclosure.

DETAILED DESCRIPTION

The present disclosure describes systems and methods that address a need in the art of audio signal processing circuits that provide for continuous and accurate current sensing of a speaker. In one embodiment, an audio system of the present disclosure includes an amplifier H-bridge output stage, one or more output current sensor circuits, and a processing block. Each output current sensor circuit includes a current sensing component, such as a current sensing amplifier, to provide current measurements and reduce the need for additional passive components. The current sensing component may introduce error that is present in the current measurement. In one embodiment, the error is reduced or removed through offset correction of the measured current in the processing block. In this regard, the processing block first determines a magnitude of a current offset, and calculates a corrected measured current from the measured current to provide an estimate of the actual speaker current.

As used herein, the term "couple" and its cognate terms such as "couples" and "coupled" can include a direct connection, a connection through intervening devices or elements, a hard-wired connection, an integrated circuit connection, a bus or other suitable connections.

Figure 1B:
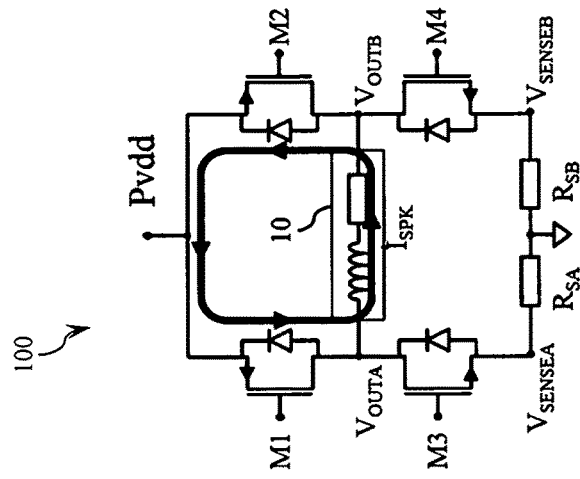
FIGS. 1A-1C illustrate currents traveling through a speaker connected to a class D amplifier output stage in accordance with embodiments of the disclosure.
Figure 1C:
Figure 1A:
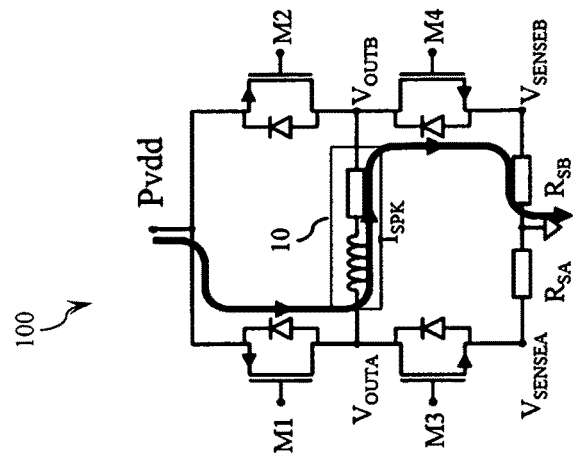

FIGS. 1A-C illustrate a current Ispk traveling through a speaker load 10 during different phases of a pulse width modulation (PWM) cycle. Sense resistors Rsa and Rsb in series between source terminals of n-channel metal oxide semiconductor (MOS) transistors M3 and M4 are used to sense the current Ispk traveling through the speaker. Sense resistors Rsa and Rsb are shown for illustrative purposes to describe current sensing of Ispk, and other current sensing devices or circuits may be used to sense current Ispk.

For example, in FIG. 1A, during a first phase of the PWM cycle, p-channel MOS transistor M1 and n-channel MOS transistor M4 are conducting and current Ispk is flowing through sense resistor Rsb. The nearly full voltage of power supply Pvdd is present across speaker load 10. The differential sense voltage Vsenseb−Vsensea is proportional to current Ispk and a sense current Isense is proportional to Ispk.

FIG. 1B illustrates a second phase of the PWM cycle where p-channel MOS transistor M1 and p-channel MOS transistor M2 are conducting. In this second phase, Pvdd is applied to both sides of speaker load 10 and the voltage differential across speaker load 10 is zero. The sense voltage, Vsenseb−Vsensea, is zero and no current is flowing through sense resistors Rsa or Rsb. A third phase of the PWM cycle, identical to the first phase, is not illustrated.

FIG. 1C shows a fourth phase of the PWM cycle and n-channel MOS transistors M3 and M4 are conducting. The differential voltage across speaker load 10 is negligible and current Ispk flows through sense resistors Rsa and Rsb. The sense voltage is proportional to twice the speaker current Ispk and sense current Isense is proportional to Ispk.

To avoid sensing at high common mode, conventional current sensing techniques often rely on the fourth phase of the PWM cycle to provide for sensing current Ispk through speaker load 10. In this regard, speaker current measurements are limited to low side sensing and provide for sensing during the fourth phase of the PWM cycle. Furthermore, passive current sense circuits such as resistors Rsa and Rsb may reduce efficiencies in the operation of the H-bridge output stage 100 and add power dissipation losses within the audio system.

Audio systems may use current sensing amplifiers for speaker current measurements. However, performance of current sensing amplifiers as effective current measuring devices may be affected by common mode and offset voltage limitations inherent in current sensing amplifiers.

Figure 2B:
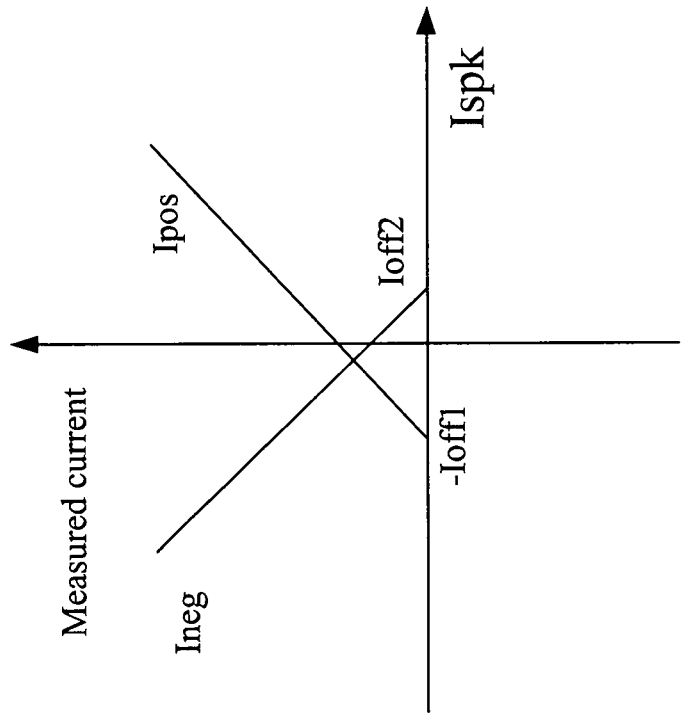
FIGS. 2A-2B illustrate graphs of measured current versus speaker current for a class D amplifier output stage of FIG. 1 in accordance with an embodiment of the disclosure.
Figure 2A:
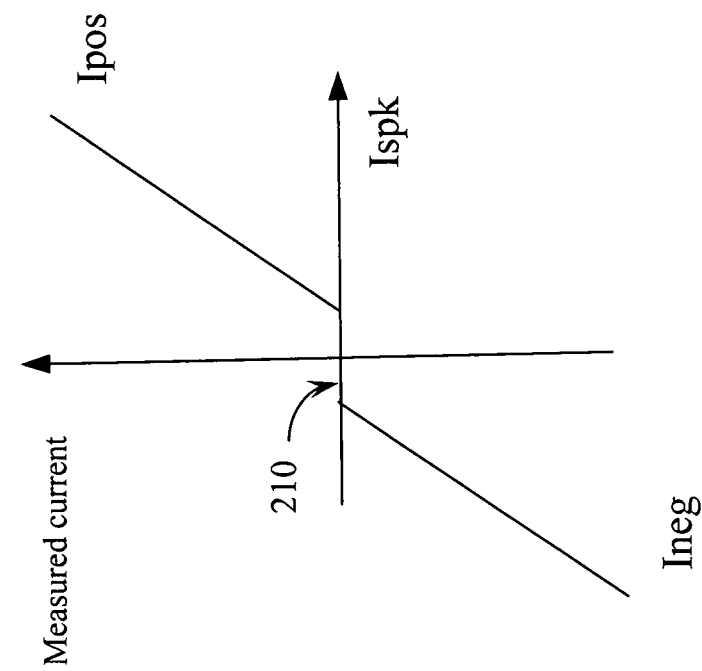

FIG. 2A illustrates a graph of measured current versus speaker current Ispk. Measured currents Ipos and Ineg are provided by a conventional current sensor used to measure speaker current Ispk of a speaker driven by a class D amplifier H-bridge output stage (e.g., such as class D amplifier H-bridge output stage 100 of FIGS. 1A-1C). Two current sensing amplifiers may be incorporated where a first current sensing amplifier provides a positive rectified current Ipos and second current sensing amplifier provides a negative rectified current Ineg. As shown in FIG. 2A, plots Ipos and Ineg show a gap 210 between Ipos and Ineg. Gap 210 may be due to offsets (e.g., such as input offset voltages) inherent in current sensing amplifiers that affect measurements of Ispk current flowing through speaker load 10. In this regard, Ispk current may be unknown in a region of speaker current along gap 210 (e.g., at near zero Ispk currents). As a result, distortion is created on speaker load current sensing.

FIG. 2B shows plots of measured rectified Ipos and Ineg currents including current offset values, Ioff1 and Ioff2. Ioff1 may be a current offset for rectified Ipos current and Ioff2 may be a current offset for rectified Ineg current. Current offset values Ioff1 and Ioff2 may be due to, for example, amplifier semiconductor technology and processes, and manufacturing tolerances. Current offset values may be random across manufactured current sensing amplifiers. As shown in FIG. 2A and 2B, current offsets contribute to current sensing amplifier errors when measuring a speaker current Ispk.

Figure 3:
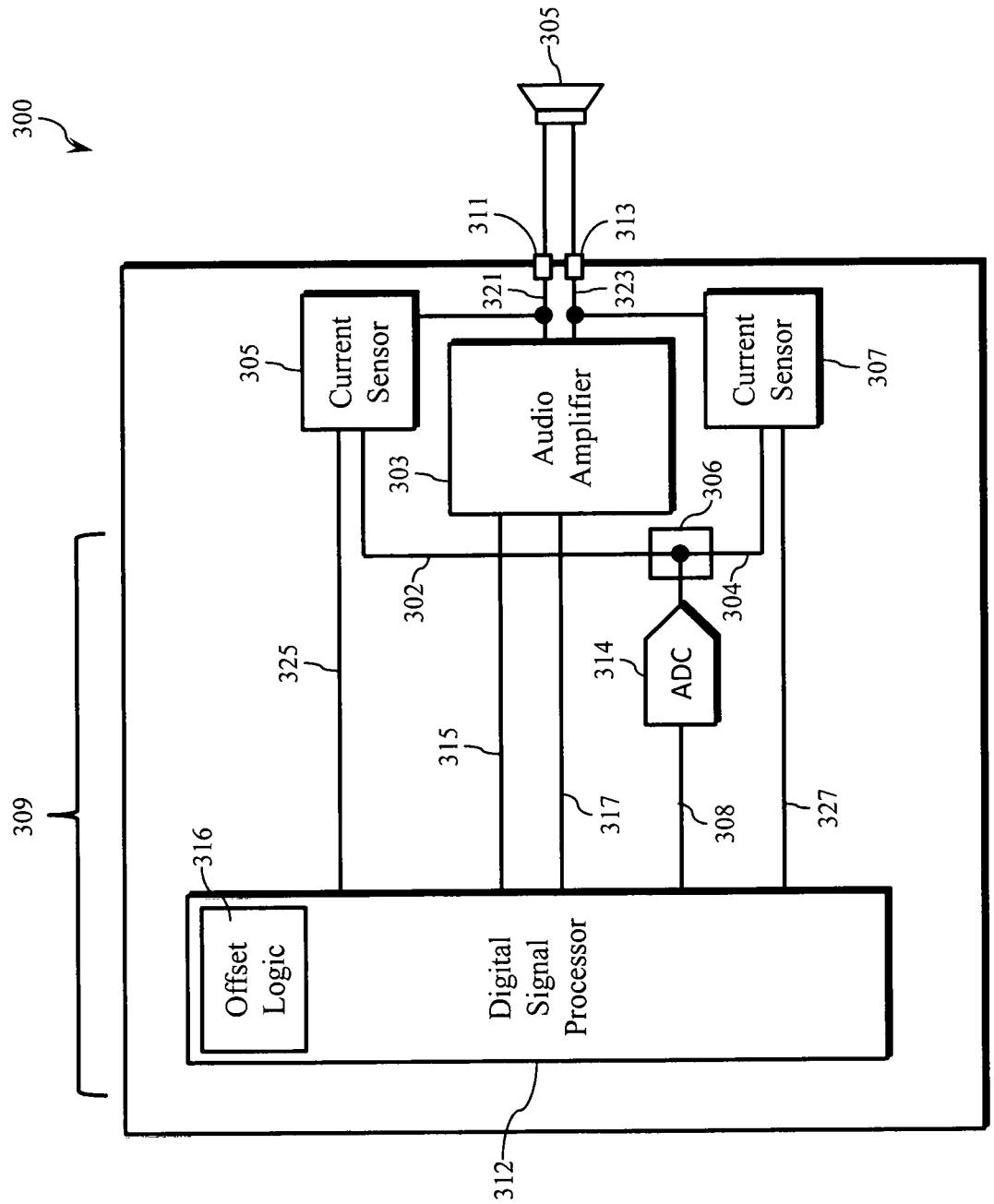
FIG. 3 illustrates a high level block diagram of an audio system in accordance with an embodiment of the disclosure.

FIG. 3 illustrates a high level block diagram of an audio system 300. In some embodiments, audio system 300 forms part of an audio codec to provide an audio output driver to a miniature speaker used in a mobile phone, laptop computer, tablet, audio/video system, or other similar portable devices that include an audio output driver. Audio system 300 includes an audio amplifier 303, current sensors 305 and 307, and a processing block 309. In some embodiments, audio output jacks 311 and 313 may connect audio system 300 to speaker 310. In other embodiments, a Bluetooth® or other wireless interface (not shown) may connect audio system 300 to speaker 310.

Figure 4:
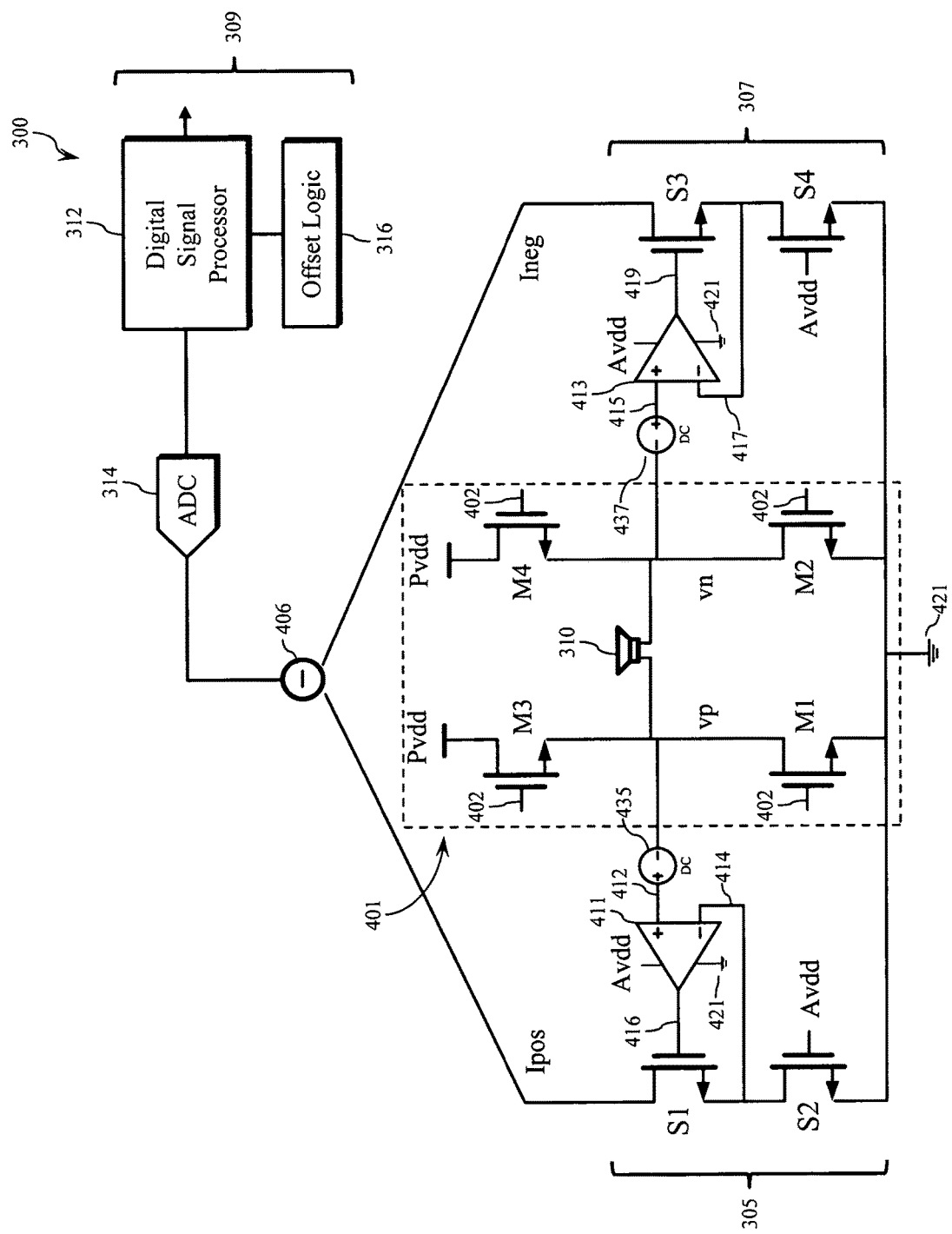
FIG. 4 illustrates a schematic diagram of an audio system in accordance with an embodiment of the disclosure.

In some embodiments, audio amplifier 303 may include a class D amplifier H-bridge output stage (such as class D amplifier H-bridge output stage 401 of FIG. 4). Audio amplifier 303 may receive pulse width modulation signals 315 and audio amplifier gain signals 317. Audio amplifier 303 is coupled to audio output jacks 311 and 313 to provide speaker drive signals 321 and 323 to speaker 310. Current sensors 305 and 307 are connected to audio amplifier 303 to measure output speaker drive signals 321 and 323, respectively.

In various embodiments, processing block 309 includes a processor 312, an analog to digital converter (ADC) 314, an offset logic circuit 316, and a current summing and voltage conversion circuit 306. ADC 314 receives an analog voltage equivalent of a measured rectified current signal 302 minus 30 (e.g., current signal Imeas) at an input port from the current combining and voltage conversion circuit 306, and provides a digital voltage signal 308 (e.g., an equivalent digitized voltage of current Imeas) to processor 312.

Processor 312 performs operations to correct measured rectified current signals 302 and 304, as discussed herein. In various embodiments, processor 312 determines current offset values Ioff1 and Ioff2, and offset logic circuit 316 provides voltage equivalent current offset value signals 325 and 327 to current sensors 305 and 307, respectively. In this regard, processor 312 may control and/or command offset logic circuit 316 to provide a positive current offset value to each of current sensors 305 and 307.

In some embodiments, processor 312 may control offset logic circuit 316 to provide a positive voltage equivalent current offset value signal 325 and 327 to current sensors 305 and 307, respectively, such that a positive non-zero current value is provided by current sensors 305 and 307 when speaker current Ispk is zero. In some embodiments, processor 312 may control offset logic circuit 316 to provide a negative voltage equivalent current offset value signal 325 and/or 327 to current sensors 305 and/or 307, respectively, to cause current sensor 305 and/or 307 to provide no measured current even when speaker current Ispk is flowing through speaker load 10. In this regard, processor 312 may control current sensors 305 and 307 to effectively turn-off sensors 305 and/or 307.

Processor may include, for example, a microprocessor, a single-core processor, a multi-core processor, a microcontroller, an application-specific integrated circuit (ASIC), a logic device (e.g., a programmable logic device configured to perform processing operations), a digital signal processing (DSP) device, one or more memories for storing executable instructions (e.g., software, firmware, or other instructions), and/or any other appropriate combinations of processing device and/or memory to execute instructions to perform any of the various operations described herein.

Processor 312 is adapted to interface and communicate with audio amplifier 303 and current sensors 305 and 307 to perform method and processing steps as described herein.

In various embodiments, it should be appreciated that processing operations and/or instructions may be integrated in software and/or hardware as part of processor 312. Embodiments of processing operations and/or instructions disclosed herein may be stored by a machine readable medium in a non-transitory manner (e.g., a memory, a hard drive, a compact disk, a digital video disk, or a flash memory) to be executed by a computer (e.g., logic or processor-based system) to perform various methods disclosed herein. In various embodiments, the machine readable medium may be included as part of processing block 309.

A schematic diagram of an audio system 300 is shown in FIG. 4 in accordance with an embodiment of the disclosure. In various embodiments, audio system 300 includes processing block 309. In some embodiments, audio system 300 includes a class D amplifier H-bridge output stage 401. Audio system 300 further includes a positive current sensor 305 (e.g., a first current sensor), a negative current sensor 307 (e.g., a second current sensor), and a measured current combining and voltage conversion circuit 306.

As shown in FIG. 4, H-bridge output stage 401 includes four n-channel metal oxide semiconductor (MOS) transistors M1, M2, M3, and M4. The respective drains of the first two, high side, transistors M3, M4 are connected to a supply voltage Pvdd. The respective sources are connected to drains of two low side transistors M1, M2 whose sources are connected to ground signal 421. A speaker load 310 is connected between the sources of M3, M4 and drains of M1, M2. An amplifier control circuit (not shown) provides the PWM signals 402 to gates of transistors M1, M2, M3, and M4.

In some embodiments, positive current sensor 305 includes a current sensing amplifier 411, and n-channel MOS transistors S1 and S2. Positive current sensor 305 senses current Ispk traveling through speaker load 310 and generates an equivalent measured rectified Ipos current. Rectified Ipos current is provided to current combining circuit 406.

Current sensing amplifier 411 includes two input terminals, positive input terminal 412 and negative input terminal 414. Positive input terminal 412 is connected to a positive terminal of an offset circuit 435. Offset circuit 435 receives a current offset value from offset logic circuit 316. A negative terminal of offset circuit 435 is connected to drain of transistor M1 (e.g., a first transistor) and source of transistor M3 (e.g., a third transistor). Negative input terminal 414 is connected to source of transistor S1 and drain of transistor S2. Current sensing amplifier 411 output terminal is connected to gate of transistor S1 to drive transistor S1. Source of transistor S2 is connected to ground signal 421. Drain of transistor S1 is connected to current combining circuit 406 to provide rectified Ipos current for combining with rectified Ineg current.

In some embodiments, negative current sensor 307 includes a current sensing amplifier 413, and n-channel MOS transistors S3 and S4. Negative current sensor 307 senses a current Ispk traveling through speaker load 310 and generates an equivalent measured rectified Ineg current. Rectified Ineg current is provided to current combining circuit 406.

Current sensing amplifier 413 includes two input terminals, positive input terminal 415 and negative input terminal 417. Positive input terminal 415 is connected to a positive terminal of an offset circuit 437. Offset circuit 437 receives a current offset value from offset logic circuit 316. A negative terminal of offset circuit 437 is connected to drain of transistor M2 (e.g., a second transistor) and source of transistor M4 (e.g., a fourth transistor). Negative input terminal 417 is connected to source of transistor S3 and drain of transistor S4. Current sensing amplifier 413 output is connected to gate of transistor S3 to drive transistor S3. Source of transistor S4 is connected to ground signal 421. Drain of transistor S3 is connected to current combining circuit 406 to provide rectified Ineg current for combining with rectified Ipos current. Power supply Avdd and ground signal 421 are connected to current sensing amplifiers 411 and 413.

As shown in FIG. 4, transistors S2 and S4 reproduce current flowing in speaker load 310. Speaker load 310 is connected between source of M3 and drain of M1 on a first end and source of M4 and drain of M2 on a second end. Transistor S2 reproduces a current flowing through transistor M1 (e.g., a first transistor) during the PWM cycles when M1 is conducting. Current Ispk flows from drain to source of M1 when M1 is conducting. Current sensing amplifier 411 output 416 drives a gate of transistor S1 to turn on transistor S1 and provide rectified current Ipos to current combining circuit 406. Power supply Avdd is connected to gates of transistors S2 and S4 to turn on transistor S2 and S4 when audio amplifier 303 is operational.

In a similar manner, transistor S4 reproduces a current flowing through transistor M2 during the PWM cycles when M2 is conducting. Current Ispk flows from drain to source of M2 when M2 is conducting. Current sensing amplifier 413 output 419 drives a gate of transistor S3 to turn on transistor S3 and provide rectified current Ineg to current combining circuit 406. In this regard, a speaker load 310 current is sensed for the complete range of Ispk current when Ispk flows through transistors M1 or M2.

In some embodiments, each of current sensing amplifiers 411 and 413 may include a current offset value caused by an inherent input offset voltage. Inherent current offsets may be due to amplifier semiconductor technology and processes, and manufacturing tolerances. Current offset values may be random across manufactured current sensing amplifiers. In this regard, referring back to FIGS. 2A and 2B, Ipos and Ineg may be a non-zero value when no current is traveling through speaker load 310 due to an inherent current offset.

Processing block 309 may intentionally add a current offset to current sensing amplifier 411 (e.g., a first current offset value) and current sensing amplifier 413 (e.g., a second current offset value). As shown in the graph of FIG. 5A, processing block 309 may provide a positive current offset value to each amplifier 411 and 413 such that the combined measured rectified Ipos current and measured rectified Ineg current are positive non-zero values when Iin (e.g. Ispk) is zero.

Figure 5B:
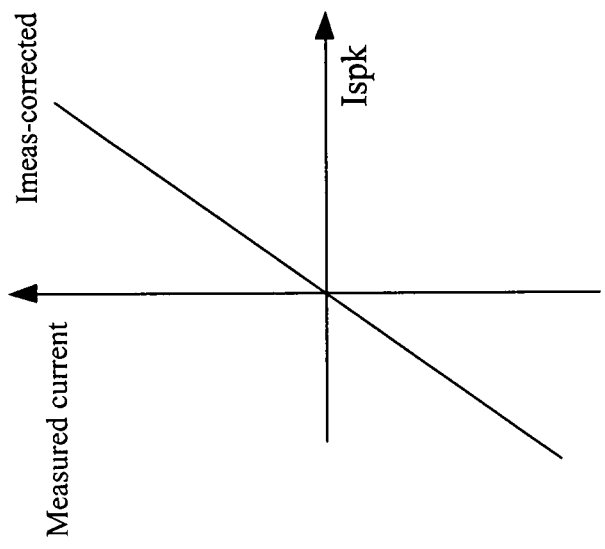
FIGS. 5A-5B illustrate plots of speaker current measurement correction in accordance with embodiments of the disclosure.
Figure 5A:
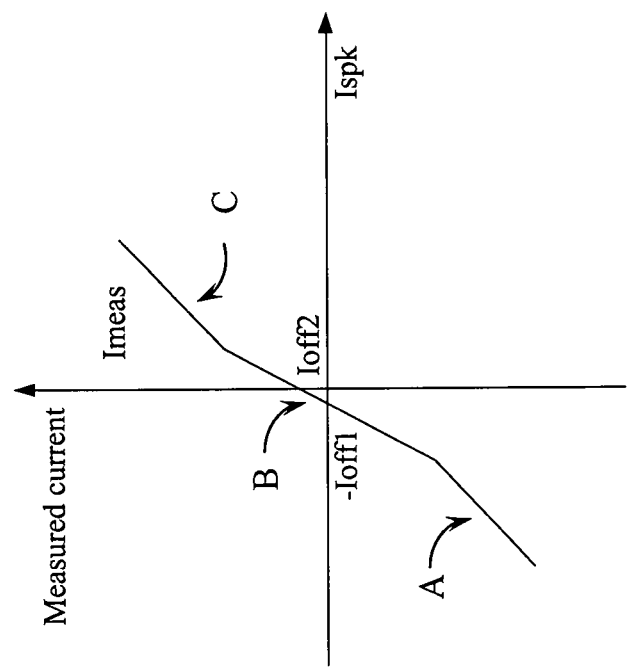

FIG. 5A shows a graph of measured rectified current over the range of Ispk (e.g., entire range of audio system 300 driven current through speaker load 310). The Imeas curve shows a plot of rectified Ipos minus rectified Ineg current, including the first and second current offset values. The curve Imeas versus Ispk is a piece-wise linear three segmented curve A, B, and C including a positive zero crossing value at Ispk equal to zero. Although the plot of Imeas in FIG. 5A is continuous with no gaps, the actual measured rectified current curve of Imeas versus Ispk should be a straight line (e.g., such a straight line plot of FIG. 5B). In this regard, Algorithm 1.0 may be used to calculate a corrected measured current (e.g., Imeas-corrected) to provide an accurate measure of the current traveling through speaker load 310.

| Algorithm 1.0 |  |
|---|---|
| if (Imeas<= −Ioff1−Ioff2) | [segment A] |
|    Imeas-corrected=Imeas+Ioff2; | |
| elseif (Imeas>= Ioff1+Ioff2) | [segment B] |
|    Imeas-corrected=Imeas−Ioff1; | |
| Else | [segment C] |
|    Imeas-corrected=(Imeas−ioff1+ioff2)/2 | |
| End | |

Applying algorithm 1.0 to the curve of Imeas versus Ispk of FIG. 5A provides for the straight line plot of Imeas-corrected versus Ispk of FIG. 5B. FIG. 5B shows Imeas-corrected equal Ispk for each Ispk value. Thus, Imeas is corrected using algorithm 1.0 to provide an accurate measured current, Imeas-corrected, of current Ispk.

Figure 6:
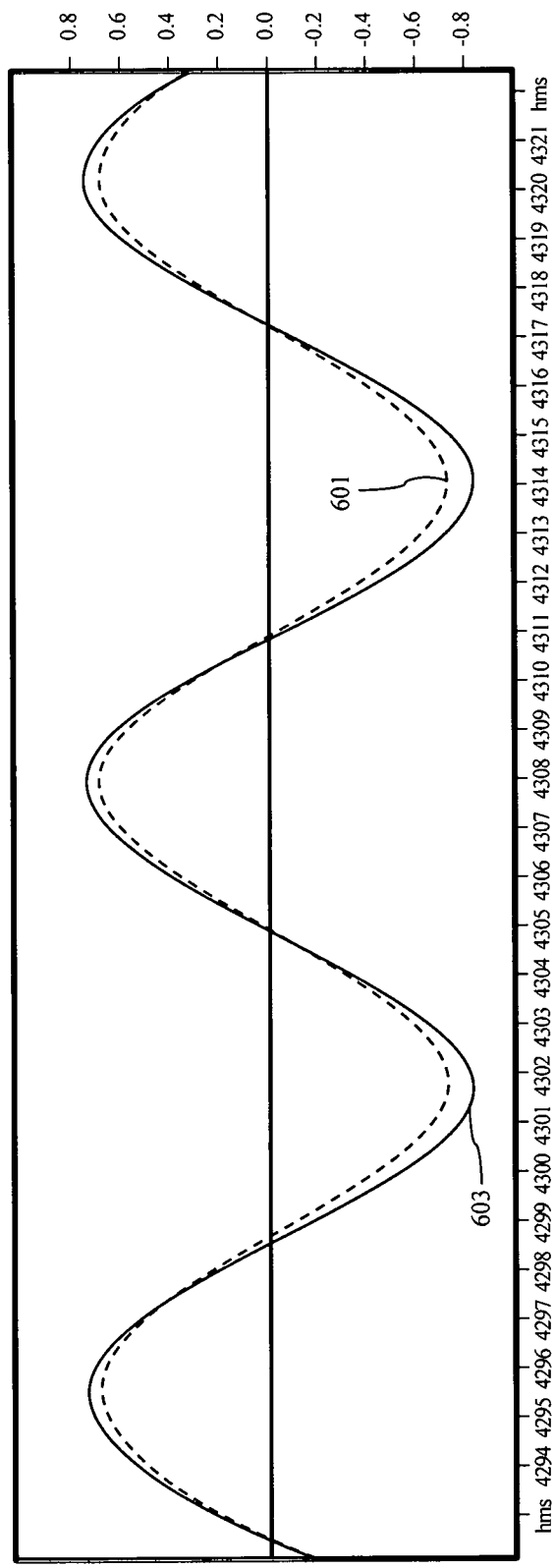
FIG. 6 illustrates waveforms of speaker current measurements in accordance with an embodiment of the disclosure.

FIG. 6 shows a graph of input speaker current prior to and after correction using algorithm 1.0. In this regard, sinusoidal current 601 is a measured current waveform prior to correction and sinusoidal current 603 is a corrected measured current waveform after applying algorithm 1.0. As shown by FIG. 6, correction by algorithm 1.0 provides a significant change in measured current providing for a more accurate and reliable measure of speaker current. In this regard, correcting measured current in the manner described above provides for improved zero crossing characteristics, which allows for sensing directly using active power devices (e.g. such as current sensing amplifiers 411 and 413) resulting in increased measurement efficiency and lower power dissipation losses compared to using passive devices for current sensing.

Figure 7:
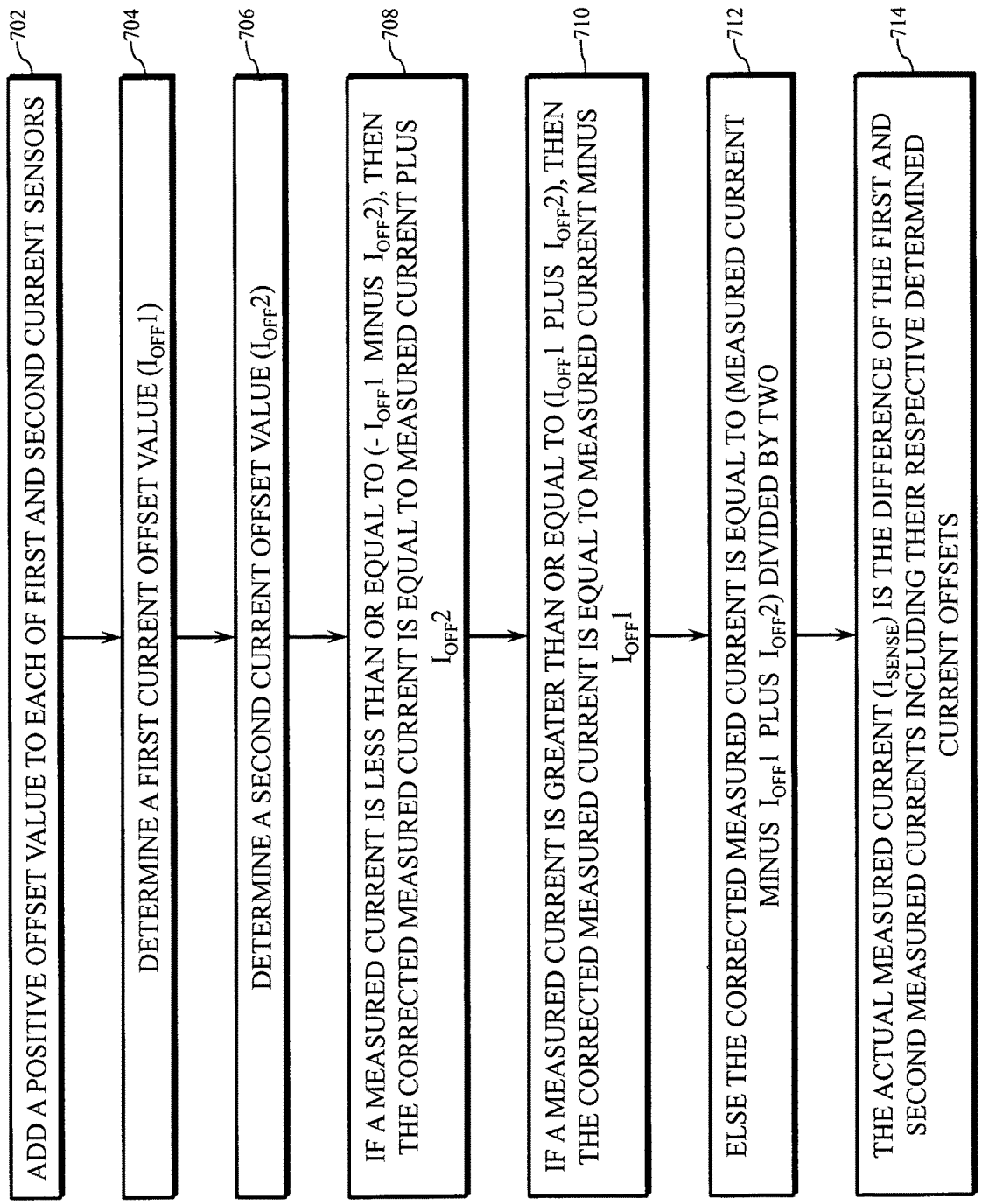
FIG. 7 is a flow diagram of a method for current measurement correction in accordance with an embodiment of the disclosure.

FIG. 7 is a flow diagram of a method for current measurement correction in accordance with an embodiment of the disclosure. In describing the flow diagram of FIG. 7, reference may be made to one or more of FIGS. 3-6. Furthermore, steps of FIG. 7 may be performed in an order different than that discussed herein.

In block 702, the flow diagram begins with adding positive offset values Ioff1 to current sensing amplifier 411 and Ioff2 to current sensing amplifier 413. Processing block 309 may add a positive current offset value for each amplifier 411 and 413 such that measured current Imeas is a positive non-zero value when Ispk is zero. A piece-wise linear plot of Imeas with a positive offset value added to each of amplifiers 411 and 413 is shown in FIG. 5A.

In block 704, the flow diagram continues with determining a first current offset value, Ioff1. A first current offset value is determined by turning off current sensing amplifier 413 and measuring speaker current Ispk. The value of Ispk with current sensing amplifier 413 turned off is the first current offset value Ioff1.

In block 706, the flow diagram continues with determining a second current offset value, Ioff2. A second current offset value Ioff2 is determined by turning off current sensing amplifier 411 and measuring speaker current Ispk. The value of Ispk with current sensing amplifier 411 turned off is the second current offset value Ioff2.

In block 708, algorithm 1.0 is performed on each Imeas value of segment A of the plot Imeas versus Ispk of FIG. 5A to provide a corrected measured speaker current Imeas-corrected. In this regard, if a measured current (of segment A) is less than or equal to the value of negative Ioff1 minus Ioff2, then the Imeas-corrected is equal to Imeas plus Ioff2.

In block 710, algorithm 1.0 is performed on each Imeas value of segment B of the plot Imeas versus Ispk of FIG. 5A. In this regard, if a measured current (of segment B) is greater than or equal to the sum of Ioff1 plus Ioff2, then Imeas-corrected is equal to Imeas minus Ioff1.

In block 712, algorithm 1.0 is performed on each Imeas value of segment C of the plot Imeas versus Ispk of FIG. 5A. In this regard, Imeas-corrected (of segment C) is equal to the value of Imeas minus Ioff1 plus Ioff2, and the value is divided by two.

In block 714, the actual measured current value Isense, after correction, is the difference of corrected measured rectified Ipos minus corrected measured rectified Ineg including their respective determined current offset values.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

Embodiments described above illustrate but do not limit the present disclosure. It should also be understood that numerous modifications and variations are possible in accordance with the principles of the present disclosure. Accordingly, the scope of the present disclosure is defined by the following claims.

What is claimed is:

1. A system for driving a speaker comprising:
    an output stage operable to drive a current through the speaker;
    a first current sensor coupled to the output stage and operable to measure a positive current through the speaker, including a first measurement error;
    a second current sensor coupled to the output stage and operable to measure a negative current through the speaker, including a second measurement error; and
    a processing block coupled to the first and second current sensors to receive the measured positive current and the measured negative current and operable to:
        add a positive offset value to an input of each of the first and second current sensors;
        determine the first and second measurement errors; and
        correct a measured current using measured positive and negative currents and the determined first and second measurement errors;
    wherein the measured current is approximately equal to the measured positive current minus the measured negative current.

2. The system of claim 1, further comprising a corrected measured speaker current, wherein the corrected measured speaker current is equal to the measured speaker current plus the second measurement error if the measured speaker current is less than or equal to a negative first measurement error minus the second measurement error.

3. The system of claim 2, further comprising the corrected measured speaker current is equal to the measured speaker current minus the first measurement error if the measured speaker current is greater than or equal to the first measurement error plus the second measurement error.

4. The system of claim 2, wherein the corrected measured speaker current is equal to the measured speaker current minus the first measurement error plus the second measurement error, divided by two.

5. The system of claim 2, wherein the processing block comprises a current-to-voltage conversion circuit operable to convert the measured speaker current to an equivalent analog voltage signal.

6. The system of claim 5, further comprising an analog to digital converter, wherein the analog to digital converter is operable to receive the analog voltage signal at an input port and provide a digitized voltage signal at an output port.

7. The system of claim 6, further comprising a processor operable to:
    receive the digitized voltage signal;
    provide the positive offset values;
    determine the first and second measurement errors; and
    correct the measured positive and negative currents.

8. The system of claim 1, wherein the processing block is further operable to turn off the second current sensor to determine the first measurement error.

9. The system of claim 1, wherein the processing block is further operable to turn off the first current sensor to determine the second measurement error.

10. The system of claim 1, wherein the added positive offset value at the input to each of the first and second current sensors generates associated magnitudes of the measured positive and negative currents that are positive non-zero values when there is no current through the speaker.

11. The system of claim 1, wherein the first and second current sensors each comprise a current sensing amplifier.

12. The system of claim 1, wherein the output stage is class D amplifier H-bridge output stage.

13. A method for driving a speaker comprising:
    driving, by an output stage, a current traveling through the speaker;
    measuring, by a first current sensor, a positive current through the speaker, including a first measurement error;
    measuring, by a second current sensor, a negative current through the speaker, including a second measurement error;
    adding a positive offset value to an input of each of the first and second current sensors;
    determining, by a processing block, the first and second measurement errors; and
    correcting a measured current using measured positive and negative currents and the determined first and second measurement errors;
    wherein the measured current is approximately equal to the measured positive current minus the measured negative current.

14. The method of claim 13, further comprising calculating a corrected measured speaker current, wherein the corrected measured speaker current is equal to the measured speaker current plus the second measurement error if the measured speaker current is less than or equal to a negative first measurement error minus the second measurement error.

15. The method of claim 14, wherein the corrected measured speaker current is equal to the measured speaker current minus the first measurement error if the measured speaker current is greater than or equal to the first measurement error plus the second measurement error.

16. The method of claim 14, wherein the corrected measured speaker current is equal to the measured speaker current minus the first measurement error plus the second measurement error, divided by two.

17. The method of claim 13, further comprising:
turning off the second current sensor to determine the first measurement error; and
turning off the first current sensor to determine the second measurement error.

18. The method of claim 13, further comprising:
converting the measured speaker current to an equivalent analog voltage signal; and
converting the analog voltage signal to a digitized voltage signal.

19. The method of claim 18, further comprising:
receiving the digitized voltage signal;
providing the positive offset values;
determining the first and second measurement errors; and
correcting the measured positive and negative currents.

20. The method of claim 13, wherein the first and second current sensors each comprise a current sensing amplifier, and wherein the output stage comprises a class D amplifier H-bridge output stage.

* * * * *

UNITED STATES PATENT AND TRADEMARK OFFICE
CERTIFICATE OF CORRECTION

| | |
|---|---|
| PATENT NO. | : 10,516,955 B2 |
| APPLICATION NO. | : 15/943613 |
| DATED | : December 24, 2019 |
| INVENTOR(S) | : Dan Shen et al. |

It is certified that error appears in the above-identified patent and that said Letters Patent is hereby corrected as shown below:

On the Title Page

Item (72), at inventor number three, delete "Ketan B. Patel, Lake Forest, CA (US);" and insert -- Ketankumar B. Patel, Lake Forest, CA (US); --

Signed and Sealed this
Nineteenth Day of July, 2022

*Katherine Kelly Vidal*

Katherine Kelly Vidal
*Director of the United States Patent and Trademark Office*